(12) United States Patent
Kumar et al.

(10) Patent No.: US 10,665,494 B2
(45) Date of Patent: May 26, 2020

(54) AUTOMATED APPARATUS TO TEMPORARILY ATTACH SUBSTRATES TO CARRIERS WITHOUT ADHESIVES FOR PROCESSING

(71) Applicant: APPLIED MATERIALS, INC., Santa Clara, CA (US)

(72) Inventors: Niranjan Kumar, Santa Clara, CA (US); Seshadri Ramaswami, Saratoga, CA (US); Shay Assaf, Gilroy, CA (US); Amikam Sade, Sunnyvale, CA (US); Andy Constant, Cupertino, CA (US); Maureen Breiling, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/885,120

(22) Filed: Jan. 31, 2018

(65) Prior Publication Data

US 2019/0237352 A1   Aug. 1, 2019

(51) Int. Cl.
*H01L 21/683* (2006.01)
*H01L 21/67* (2006.01)
*H01L 21/3065* (2006.01)
*H01L 21/687* (2006.01)

(52) U.S. Cl.
CPC ...... *H01L 21/6835* (2013.01); *H01L 21/3065* (2013.01); *H01L 21/67092* (2013.01); *H01L 21/67132* (2013.01); *H01L 21/6831* (2013.01); *H01L 21/6833* (2013.01); *H01L 21/6836* (2013.01); *H01L 21/6838* (2013.01); *H01L 21/68742* (2013.01)

(58) Field of Classification Search
None
See application file for complete search history.

(56) References Cited

U.S. PATENT DOCUMENTS

| | | | |
|---|---|---|---|
| 4,962,441 | A | 10/1990 | Collins |
| 5,818,682 | A | 10/1998 | Loo |
| 6,185,085 | B1 | 2/2001 | Hwang et al. |
| 7,027,283 | B2 | 4/2006 | Landesberger et al. |
| 7,336,015 | B2 | 2/2008 | Arlt et al. |

(Continued)

FOREIGN PATENT DOCUMENTS

DE   102011107598 A1   1/2013

*Primary Examiner* — Jiong-Ping Lu
(74) *Attorney, Agent, or Firm* — Schwabe, Williamson & Wyatt, P.C.

(57) ABSTRACT

Embodiments include a method for processing thin substrates. Embodiments may include electrostatically bonding a substrate to a first electrostatic carrier (ESC), with a backside of the substrate is facing away from the first ESC. Thereafter, the substrate may be thinned to form a thinned substrate. The thinned substrate may then be transferred to a second ESC with a front side of the thinned substrate facing away from the second ESC. Embodiments may include cleaning the front side surface of the thinned substrate and transferring the thinned substrate to a third ESC. In an embodiment, a backside of the thinned substrate is facing away from the third ESC. Embodiments may also include processing the backside surface of the thinned substrate, and transferring the thinned substrate to a tape frame.

20 Claims, 9 Drawing Sheets

(56) References Cited

U.S. PATENT DOCUMENTS

| | | |
|---|---|---|
| 8,181,688 B2 | 5/2012 | Johnson et al. |
| 8,503,156 B2 | 8/2013 | Ray et al. |
| 2002/0170882 A1 | 11/2002 | Akiba |
| 2011/0198817 A1 | 8/2011 | Hurley et al. |
| 2011/0309647 A1 | 12/2011 | Yang et al. |
| 2012/0227886 A1 | 9/2012 | Hsiao et al. |
| 2012/0238073 A1* | 9/2012 | Johnson .............. H01L 21/3065 438/464 |
| 2014/0071581 A1 | 3/2014 | Haas et al. |
| 2014/0158303 A1 | 6/2014 | Hirakawa et al. |
| 2015/0262854 A1* | 9/2015 | You .................... H01L 21/3065 438/692 |

* cited by examiner

AUTOMATED APPARATUS TO TEMPORARILY ATTACH SUBSTRATES TO CARRIERS WITHOUT ADHESIVES FOR PROCESSING

BACKGROUND

1) Field

Embodiments relate to the field of semiconductor manufacturing and, in particular, to systems and methods for processing thin substrates with electrostatic carries that do not use adhesives.

2) Description of Related Art

In order to process thinned down substrates (e.g., 20-50 µm), the substrates are often mounted on carriers, such as silicon or glass carriers. The carriers allow for the thinned substrates to be transferred about a fabrication facility and/or processed without damaging the thinned down substrates. Currently, the substrates are mounted to the carriers with glues or other adhesives. However, the use of adhesives have significant drawbacks. For example, adhesives and glues have temperature limits of about 180° C. This significantly limits which processing operations may be used. Particularly, substrates bonded to carriers with adhesives cannot be exposed to higher temperature processing operations such as, chemical vapor deposition (CVD), annealing, and/or wafer-to-wafer bonding.

Furthermore, adhesive bonded systems have high total thickness variation (TTV) due to intrinsic adhesive material properties and uses mechanical de-bond which causes damage to thin wafers. These limitations make it difficult to scale incumbent technologies for ultra-thin wafers (e.g., 5-20 µm thickness range). Additionally, the adhesive makes debonding the substrate from the carrier difficult and may result in damage to the thin substrate during debonding.

SUMMARY

Embodiments include a method for processing thin substrates. In an embodiment, the method may include electrostatically bonding a substrate to an electrostatic carrier (ESC). The substrate may then be thinned to form a thinned substrate and the thinned substrate may be processed. After processing the thinned substrate, the thinned substrate may be transferred to a tape frame.

In an additional embodiment, a method for processing thin substrates may include electrostatically bonding a substrate to a first electrostatic carrier (ESC), with a backside of the substrate is facing away from the first ESC. Thereafter, the substrate may be thinned to form a thinned substrate. The thinned substrate may then be transferred to a second ESC with a front side of the thinned substrate facing away from the second ESC. Embodiments may include cleaning the front side surface of the thinned substrate and transferring the thinned substrate to a third ESC. In an embodiment, a backside of the thinned substrate is facing away from the third ESC. Embodiments may also include processing the backside surface of the thinned substrate, and transferring the thinned substrate to a tape frame.

DETAILED DESCRIPTION

Systems and methods for processing thin substrates mounted on electrostatic carriers are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, thinned substrates are currently mounted on carriers with adhesives or glues. Such apparatuses and bonding methodologies result in significant drawbacks such as processing temperature restrictions, poor scaling to ultra-thin substrates, and damage to the substrate during debonding. Additionally, when adhesives or glues are used, only a single surface of the substrate can be processed. Accordingly, embodiments described herein provide systems and methods for processing thinned substrates without the use of adhesives or glues.

Particularly, embodiments include processing thinned substrates that are mounted to electrostatic carriers. In such embodiments, the electrostatic carrier allows for the substrate to be supported at all times and further allows for the transfer of the substrate off of the carrier without damaging the thinned substrate. Embodiments described herein that include the use of electrostatic carriers allow for improved TTV and planarity since there is no adhesive between the substrate and the carrier. Such processing architectures also enable wider process windows. For example, higher processing temperatures (e.g., greater than approximately 180° C.) may be used because there is no adhesive, and the substrate may be thinner (e.g., 5-20 μm thickness range) without increasing the risk of damage during debonding.

Figure 1:
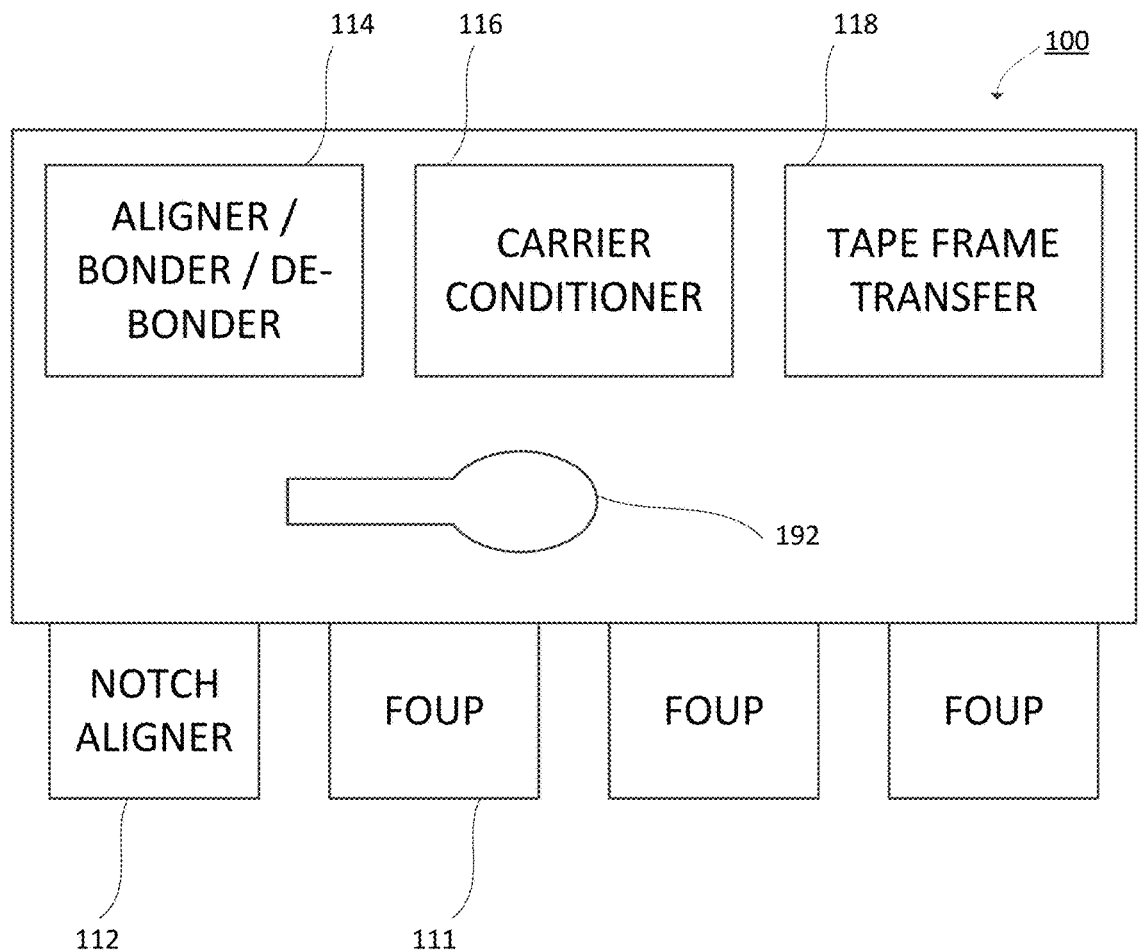
FIG. 1 is a diagram of a processing tool that may be used to mount substrates to electrostatic carriers, according to an embodiment.

According to an embodiment, substrates may be mounted to electrostatic carriers with an integrated bond/de-bond tool (i.e., a cluster tool) that includes a plurality of modules. A schematic illustration of such a cluster tool 100 is shown in FIG. 1, according to an embodiment. In a particular embodiment, the cluster tool 100 may include at least four or more modules. For example, the cluster tool may include one or more front opening unified pods (FOUPs) 111, a notch aligner 112, an aligner/bonder/de-bonder 114, a carrier conditioner 116, and a tape frame transfer tool 118. The FOUPs 111 may include a plurality of substrates and/or electrostatic carriers (not shown) that will be transferred throughout the cluster tool 100. The substrates and electrostatic carriers may be transferred between modules in the tool by a substrate/carrier handling robot 192. Embodiments include a cluster tool 100 that is used to mount the substrates to the electrostatic carriers within a single tool. However, it is to be appreciated that the modules within the cluster tool 100 may also be implemented as discrete modules, according to different embodiments. For example, the tape frame transfer tool 118 may be implemented as a distinct tool from the aligner/bonder/de-bonder 114.

Figure 2:
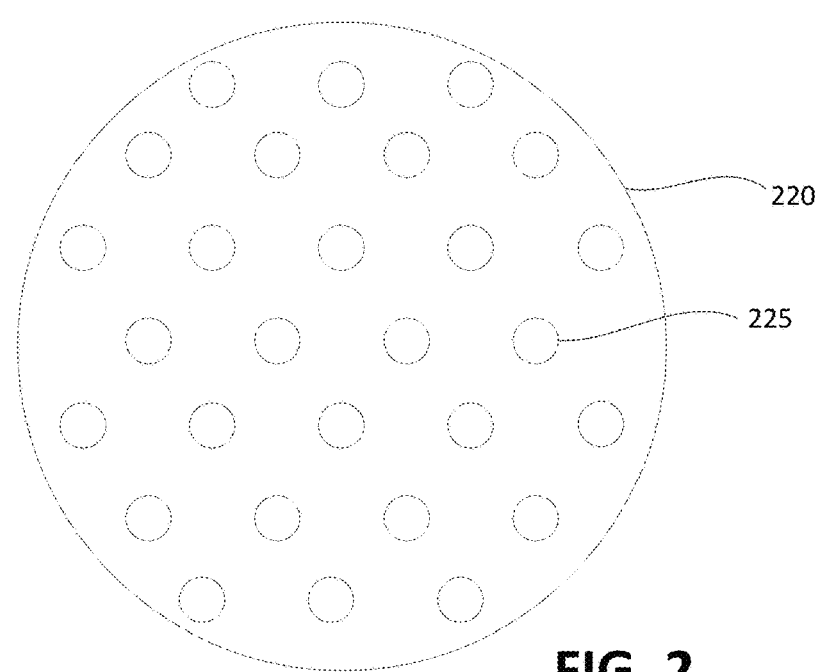
FIG. 2 is a plan view of an electrostatic carrier according to an embodiment.

As noted above, embodiments utilize electrostatic carriers for supporting thinned substrates. An example of such an electrostatic carrier (ESC) 220 is illustrated in FIG. 2, according to an embodiment. The ESC 220 may be any suitable carrier substrate that is capable of being securely bonded to a thin film substrate. In an embodiment, the ESC 220 may be substantially the same size (e.g., surface area and shape) of the substrate that is being processed. In an embodiment, the ESC 220 maintains an electrostatic force that can secure the substrate over an extended period of time (e.g., hours to days) after disconnecting an external power supply from the ESC 220. In an embodiment, the ESC 220 may be a ceramic material, a glass, or a semiconductor material (e.g., silicon) that includes electrodes formed over a surface (not shown). A dielectric cover (not shown) may then be formed over a top surface of the electrodes in order to form a capacitive force between the device substrate and the ESC 220.

Furthermore, embodiments include a plurality of purge holes 225 formed through the ESC 220. In an embodiment, the purge holes extend completely through the thickness of the ESC 220. The use of electrostatic carriers with purge holes 225 allows for improved bonding and de-bonding between the ESC 220 and the substrate. For example, the purge holes 225 allow for vacuum coupling between the ESC 220 and the substrate, which ensures that no sliding between the two components occurs as the substrate is electrostatically bonded to the electrostatic carrier. Additionally, evacuating trapped air from the "carrier to substrate" interface improves the bonding. According to an embodiment, the presence of the purge holes 225 allow for the bonding interface between the electrostatic carrier and the substrate to have controllable environmental conditions (e.g., pressure, humidity, cleanliness, air flow, filters, etc.) in order to maintain a high bonding quality between the components.

In the illustrated embodiment, the purge holes 225 are illustrated as being a plurality of circular holes evenly distributed across the surface of the ESC 220. However, it is to be appreciated that the purge holes 225 may be any shape and/or size. For example, the purge holes 225 may be square, rectangular, elliptical, oblong, or the like. Furthermore, all of the purge holes 225 do not need to be the same shape and/or size, according to additional embodiments.

Figure 3:
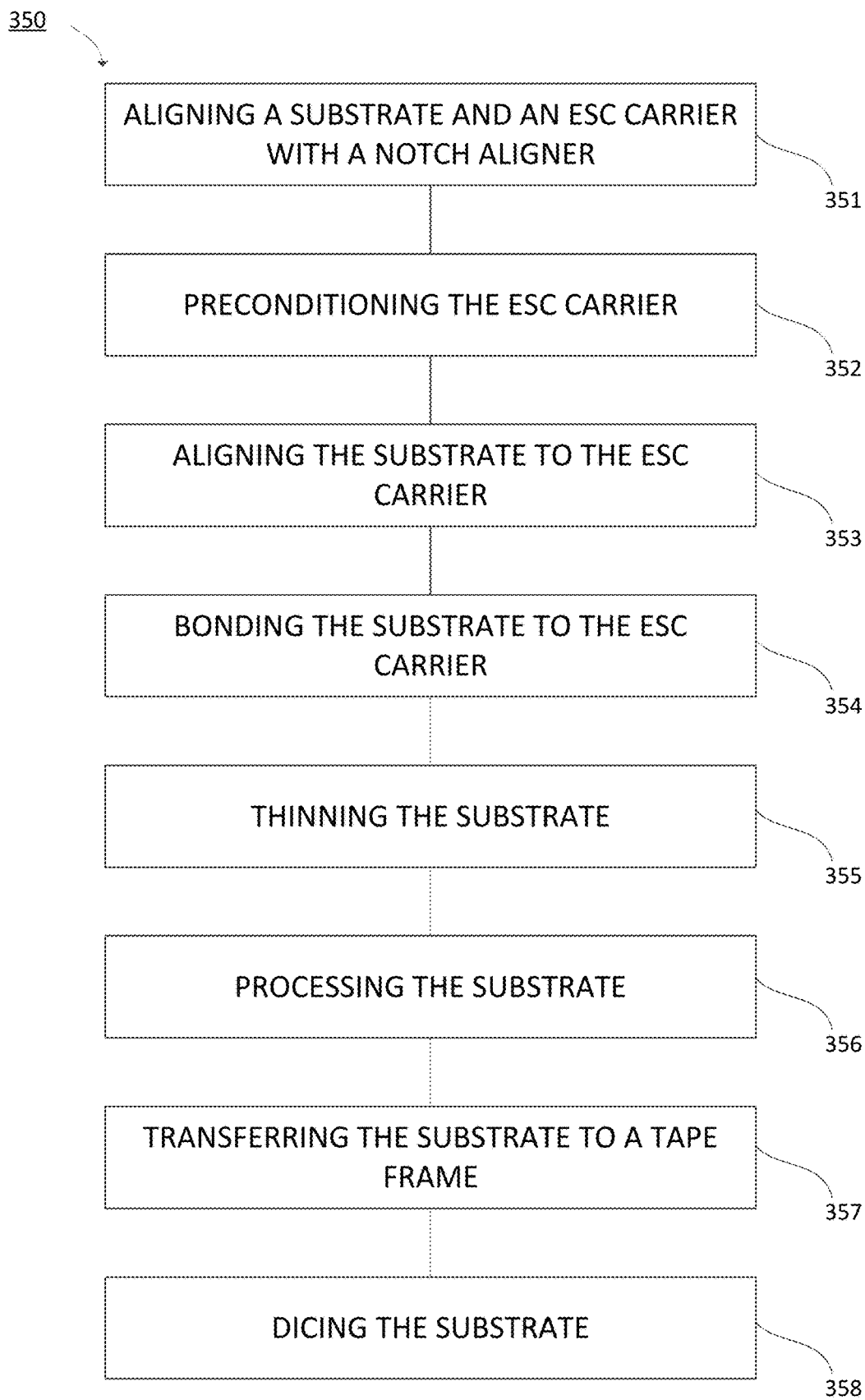
FIG. 3 is a process flow diagram of processing operations used to process a thinned substrate using an electrostatic carrier, according to an embodiment.

Referring now to FIG. 3, a process 350 for handling and processing a substrate with the use of an electrostatic carrier is shown, according to an embodiment. At operation 351 the process may include aligning a substrate and an electrostatic carrier with a notch aligner 112. In an embodiment, operation 351 may include removing a substrate and an ESC from FOUPs 111 with the robot 192. The substrate and the ESC may then be aligned with the notch aligner 112. The notch aligner 112 may provide a gross alignment, as is commonly known in the art.

Referring now to operation 352, embodiments may include preconditioning the ESC in the carrier conditioner 116. In an embodiment, the robot 192 may transfer the electrostatic carrier from the notch aligner to the carrier conditioner 116. Once in the carrier conditioner 116, the electrostatic carrier may be subjected to conditions that optimize the electrostatic carrier for bonding with a substrate. In an embodiment, the carrier conditioner may condition a single electrostatic carrier at a time or a batch of electrostatic carriers at a time. In an embodiment, the preconditioning may include a baking process, a cooling process, a vacuum purge process, or the like. In an embodiment, the carrier conditioner 116 may utilize any suitable energy source, such as oven heating, microwave, infrared (IR) based heating, or the like. In an embodiment, the preconditioning may be implemented under a vacuum. For example, the vacuum levels may be several Torr to 1E-6 Torr.

Referring now to operation 353, embodiments may include aligning the substrate to the ESC in the aligner/bonder/de-bonder module 114. In an embodiment, the substrate that is aligned to the ESC may be a full thickness device substrate (i.e., a substrate that has not been thinned). In an embodiment, the alignment may be implemented with precision centricity alignment (e.g., alignment of the center of the substrate may be within +/−40 μm of the center of the ESC). The precision alignment may be implemented with a dual telocentric lens mechanism, accurate XYTZ stage, null target, image processing to detect substrate and carrier edges and notches accurately, algorithms to translate between the different coordinate systems, and/or multi point measurement to obtain high accuracy and less sensitivity to edge variations. Furthermore, the aligner/bonder/de-bonder module 114 may have improved accuracy by using high mass systems (e.g., granite slabs) and low resonance systems that allow for improved alignment. A high precision alignment ensures that minimal damage (e.g., edge chipping, breakage) occurs to expensive device substrates during thinning and post-thinning processes (e.g., etching, chemical vapor deposition (CVD), physical vapor deposition (PVD), electrochemical deposition (ECD), chemical vapor deposition (CMP), or the like).

Figure 4A:
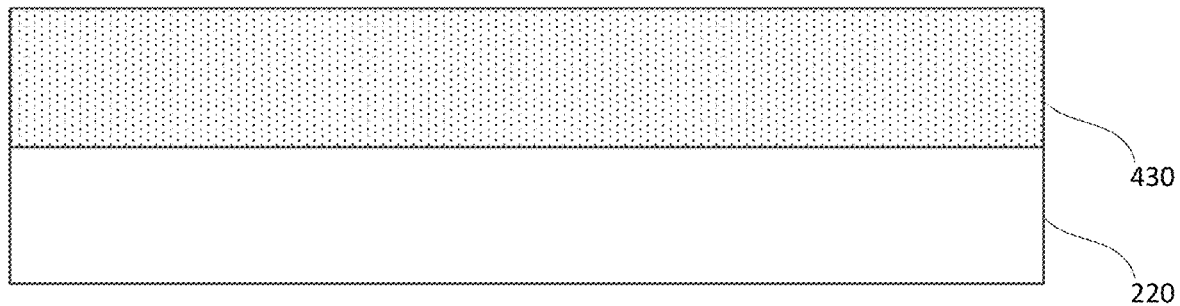
FIG. 4A is a cross-sectional illustration of a substrate mounted on an electrostatic carrier, according to an embodiment.

Referring now to operation 354, embodiments include bonding the substrate to the ESC in the aligner/bonder/debonder module 114. A cross-sectional illustration of a substrate 430 mounted onto an ESC 220 is shown in FIG. 4A. In an embodiment, the substrate 430 that is mounted to the ESC 220 is a standard substrate (i.e., a substrate that has not been thinned). For example, the substrate 430 may have a thickness that is approximately 200 µm or greater. According to an embodiment, the substrate 430 is bonded to the ESC 220 with an electrostatic force. In an embodiment, the electrostatic bonding of ESC 220 to the substrate 430 is implemented in a vacuum environment. Vacuum coupling ensures no sliding occurs during bonding and evacuates trapped air from the interface between the ESC 220 and the substrate 430. The air is able to be evacuated from the interface because the purge holes (not visible in FIG. 4A). Additional embodiments may also include controlling environmental conditions (e.g., pressure, humidity, cleanliness, air flow, filters, etc.) in order to achieve high bonding quality between the ESC 220 and the substrate 430.

Figure 4B:
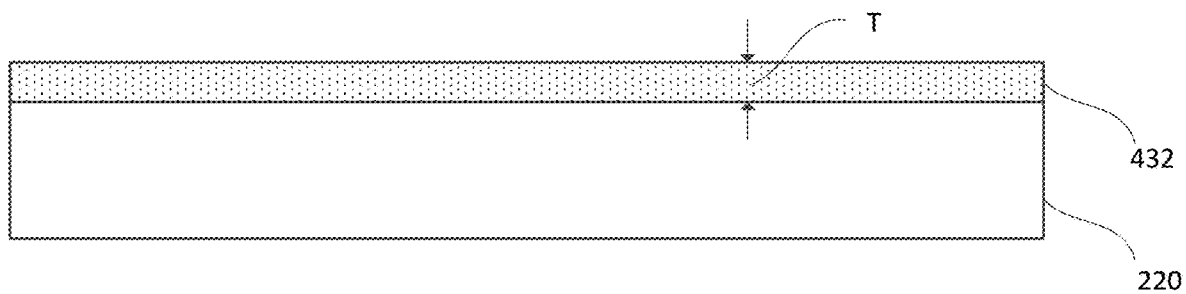
FIG. 4B is a cross-sectional illustration of the substrate mounted on an electrostatic carrier after the substrate has been thinned, according to an embodiment.

Referring now to operation 355, embodiments include thinning the substrate 430 to formed a thinned substrate 432. A thinned substrate 432 mounted to the ESC 220 is shown in FIG. 4B. In an embodiment, the thinned substrate 432 may have a thickness T that is less than approximately 50 µm. In an embodiment, the thickness T may be less than approximately 10 µm. Such thicknesses may be obtained due to the high quality bond between the ESC 220 and the thinned substrate 432. Furthermore, since the thinned substrate 430 is supported by the ESC 220, it may be handled and/or processed further without risking damage to the thinned substrate 432.

According to an embodiment, the substrate 430 may be thinned with any suitable tool. For example, the substrate 430 may be thinned with a chemical mechanical polishing (CMP) process. In an embodiment, the thinning process may be implemented in a tool outside of the cluster tool 100. Additional embodiments may include a thinning tool that is integrated within the cluster tool 100.

Figure 4C:
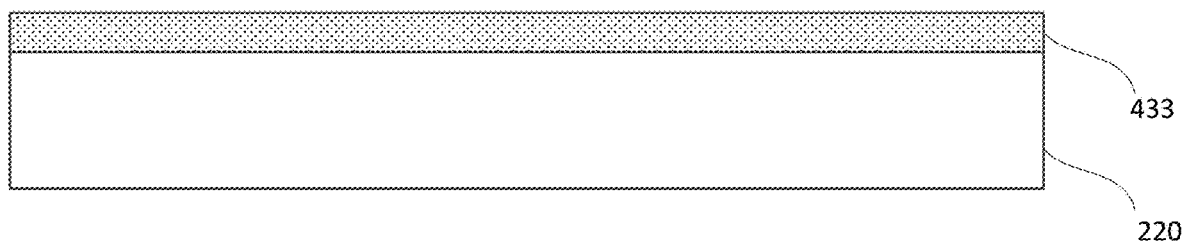
FIG. 4C is a cross-sectional illustration of the thinned substrate after it has been processed, according to an embodiment.

Referring now to operation 356, the thinned substrate 432 may be processed, according to an embodiment. An example of a processed substrate 433 is shown in FIG. 4C. The processed substrate 433 is illustrated with different shading than the unprocessed substrate 432 in order to represent some change to the substrate. While the entire substrate is shaded differently, it is to be appreciated that the processing may alter a top surface of the thinned substrate 432 or any other portion of the thinned substrate 432. According to an embodiment, the thinned substrate 432 may be processed with any suitable processing operation. For example the thinned substrate 432 may be processed with one or more processes such as, etching, CVD, PVD, ECD, CMP, or the like. In an embodiment, the processing may also include cleaning the surface of the thinned substrate 432 prior to subsequent processing. According to an embodiment, the thinned substrate 432 may be processed in a tool other than the cluster tool 100. Additional embodiments may also include a processing tool that is integrated with the cluster tool 100.

Figure 4D:
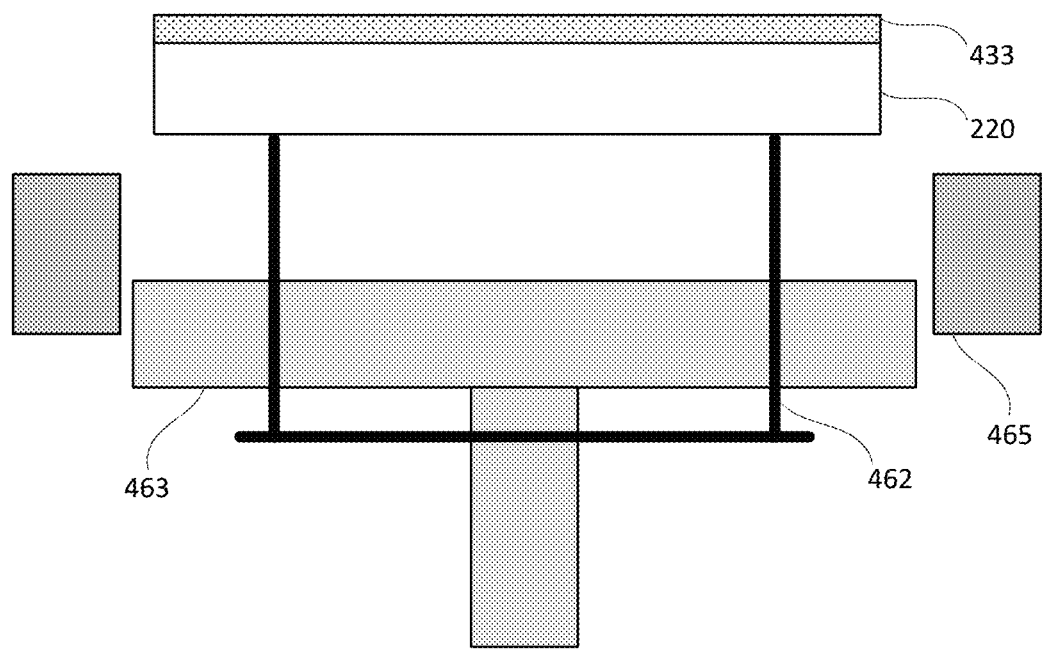
FIG. 4D is a cross-sectional illustration of the thinned substrate after it has been transported into a debonding tool, according to an embodiment.
Figure 4E:
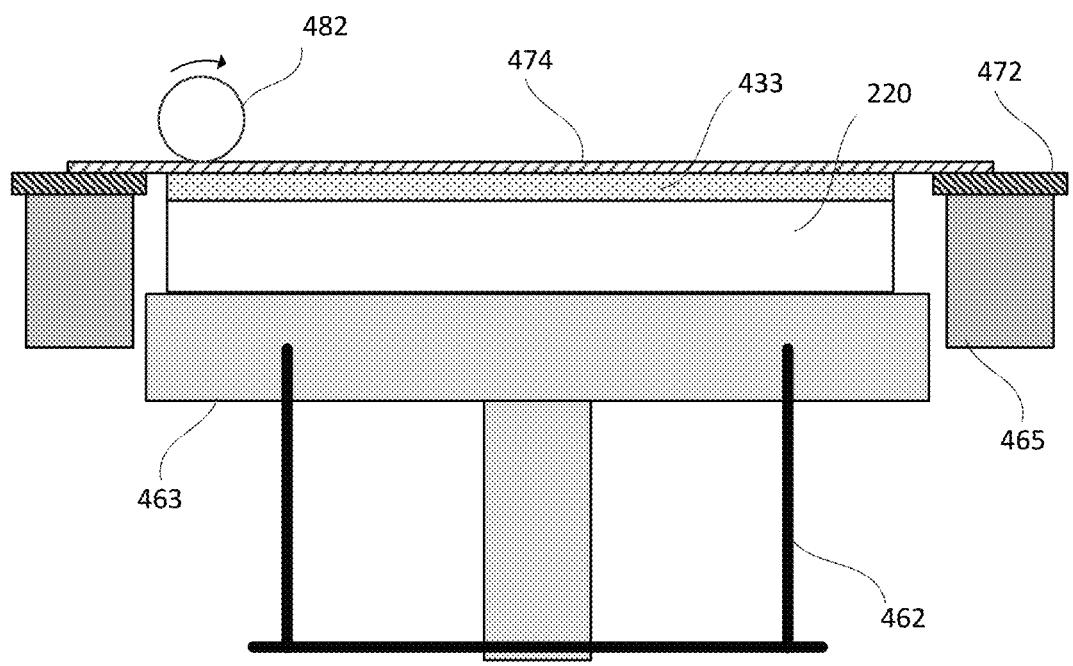
FIG. 4E is a cross-sectional illustration of the thinned substrate being mounted to a tape frame in the debonding tool, according to an embodiment.

After processing, the processed substrate 433 and the ESC 420 may be transferred back to the cluster tool 100 (if the processing was implemented in an external tool) and delivered to the tape frame transfer module 118 by robot 192. Once in the transfer module 118, process 350 may continue with operation 357 that includes transferring the processed substrate 433 to a tape frame. According to an embodiment, the tape frame transfer module 118 may include components for transferring the processed substrate 433 to the tape frame. A schematic of the components in the transfer module 118 are shown in FIG. 4D. As illustrated, the ESC 220 and processed substrate 433 are shown being supported by lift pins 462. The lift pins 462 may pass through a transfer chuck 463. The lift pins 462 may be lowered so that the ESC 220 rests on the transfer chuck 463, as illustrated in FIG. 4E. According to an embodiment, the transfer chuck 463 may be an electrostatic chuck and/or a vacuum chuck.

Also illustrated in FIG. 4E, a tape frame 472 is placed on a tape frame support 465. The tape frame 472 may be any suitable tape frame known in the art. A tape material 474 may be attached to the tape frame and cover the opening of the tape frame 465. In an embodiment, a roller 482 may be rolled over the tape 474 to attach the tape to the surface of the processed substrate 433. The use of the roller may be used to remove air from the interface between the tape 474 and the processed substrate 433. According to an embodiment, the electrostatic force between the ESC 220 and the processed substrate 433 may be released. At this point, the electrostatic carrier 220 and the processed substrate 433 are still in direct contact with each other. Mechanically separating the processed substrate 433 from the electrostatic carrier may result in damage to the processed substrate 433 since the reduced thickness diminishes the structural integrity of the processed substrate 433. Accordingly, embodiments include injecting air or any other suitable gas between the ESC 220 and the processed substrate 433 in order to allow the detachment of the processed substrate 433 from the ESC 220 without any mechanical intervention. For example, the air purge may be uniformly applied through the purge holes of the electrostatic carrier.

Figure 4F:
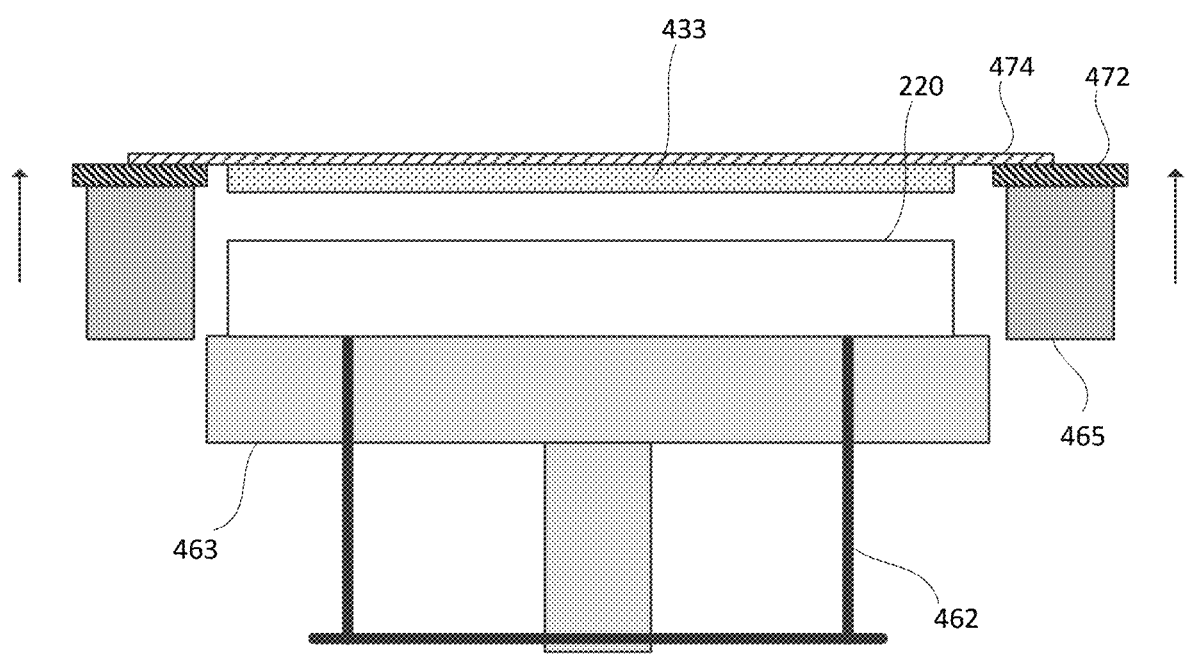
FIG. 4F is a cross-sectional illustration of the thinned substrate being removed from the electrostatic chuck, according to an embodiment.

Referring now to FIG. 4F, the tape frame 472 may be lifted by supports 465 after the air purge, as indicated by the arrows. According to an embodiment, mechanical displacement of the tape frame 472 does not occur until after the electrostatic carrier 220 and the processed substrate 433 are separated from each other by the air purge. Thereafter, at operation 358, the process may include removing the tape frame from the cluster tool 100 (e.g., with robot 192) so that the processed substrate 433 may be diced. The dicing process may be any suitable dicing process known in the art. For example, the processed substrate 433 mounted on the tape frame 472 may be diced with a laser dicing tool, a mechanical dicing tool, or a combination of any suitable tools.

While the above referenced process is suitable for processing a single surface of the substrate, it is to be appreciated that embodiments also allow for the processing of both surfaces of the substrate. Particularly, since there is no adhesive needed, the substrate may be flipped over using more than one electrostatic chuck, as will be described in greater detail below. In such embodiments, the thinned substrate remains supported by at least one electrostatic chuck at all times in order to maintain structural integrity and minimizes damage.

Figure 5:
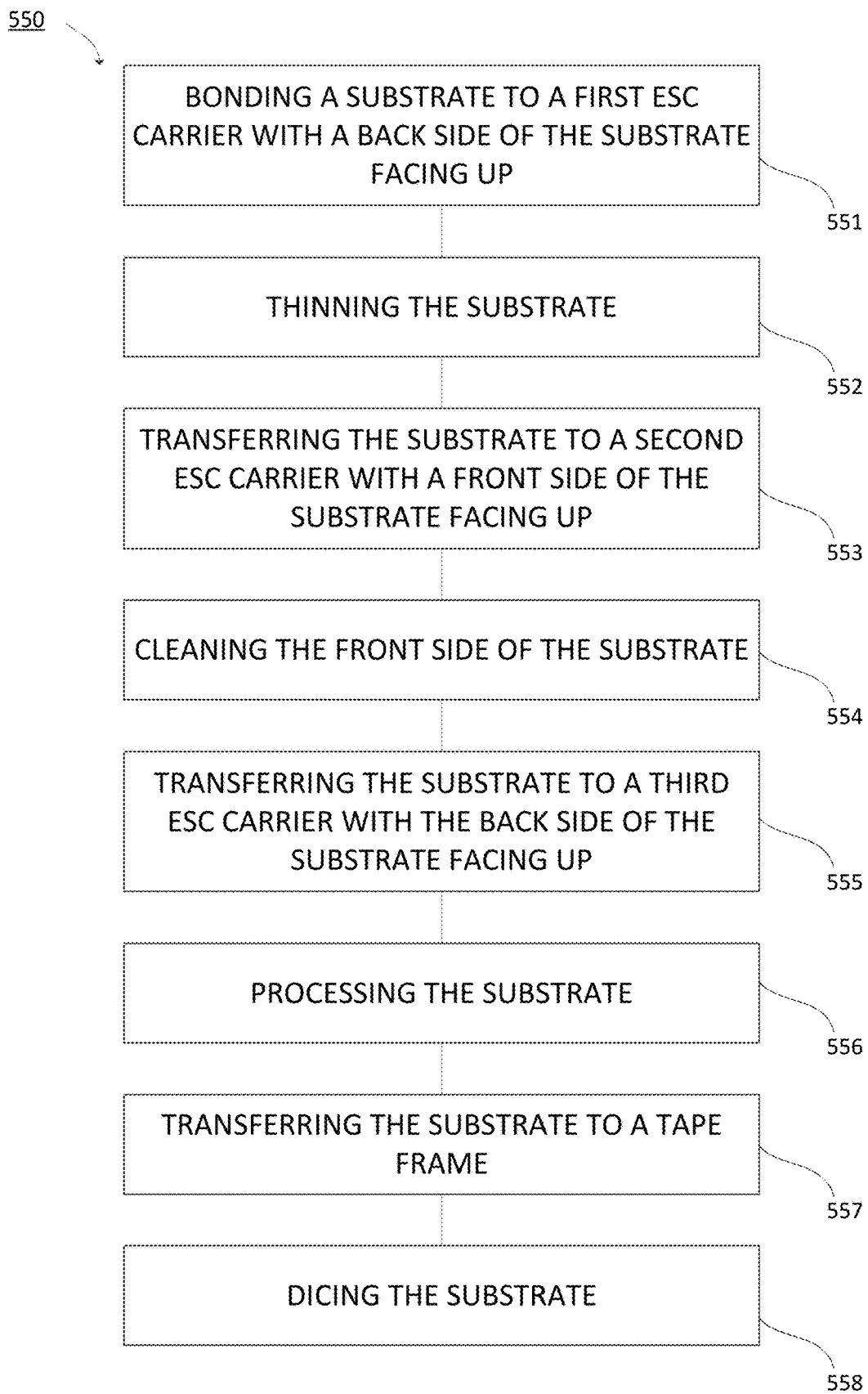
FIG. 5 is a process flow diagram of processing operations used to process a thinned substrate using a plurality of electrostatic carriers, according to an additional embodiment.

Referring now to FIG. 5, a process 550 that may be used for processing more than one surface of a thinned substrate while using a plurality of electrostatic carriers is described according to an embodiment. Starting with operation 551, process 550 may include bonding a substrate to a first ESC with a backside of the substrate facing up. In an embodiment, the bonding operation may be substantially similar to operations 351-353 in process 350 described above in FIG. 3. For example, prior to bonding the substrate to the first ESC, the ESC and the substrate may be aligned, preconditioned, or the like. In an embodiment, the substrate is bonded to the first ESC in the aligner/bonder/de-bonder module 114 of the cluster tool 100. In an embodiment, the electrostatic carrier may be substantially similar to the electrostatic carrier 220 described above.

Figure 6A:
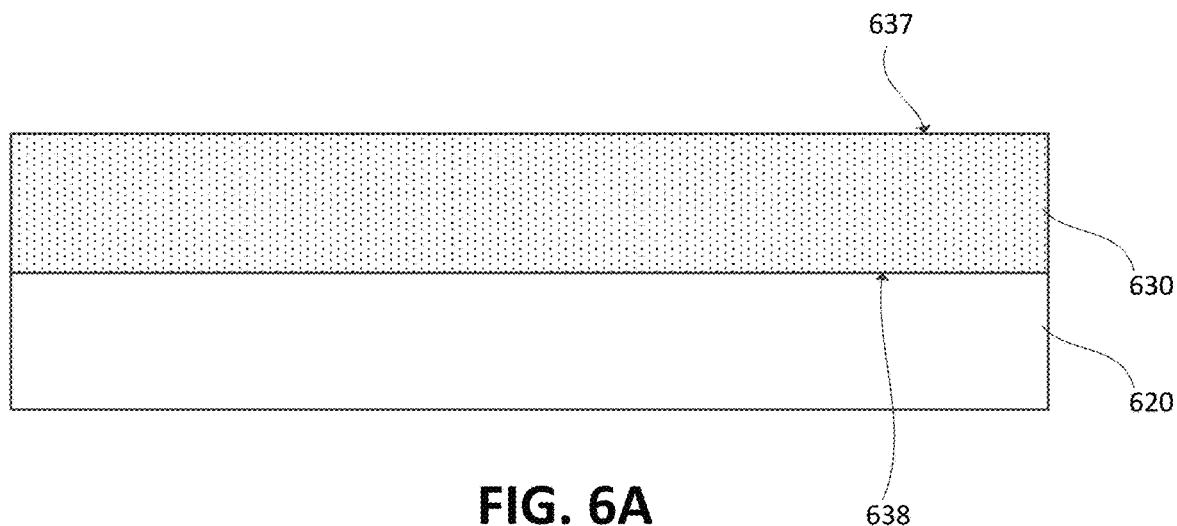
FIG. 6A is a cross-sectional illustration of a substrate mounted on a first electrostatic carrier, according to an embodiment.

FIG. 6A is a cross-sectional illustration of the substrate 630 bonded to an ESC 620 according to an embodiment. As shown, the substrate 630 includes a backside surface 637 that is facing away from the ESC 620 and a front side surface 638 that is facing towards (and in contact with) the ESC 620.

Figure 6B:
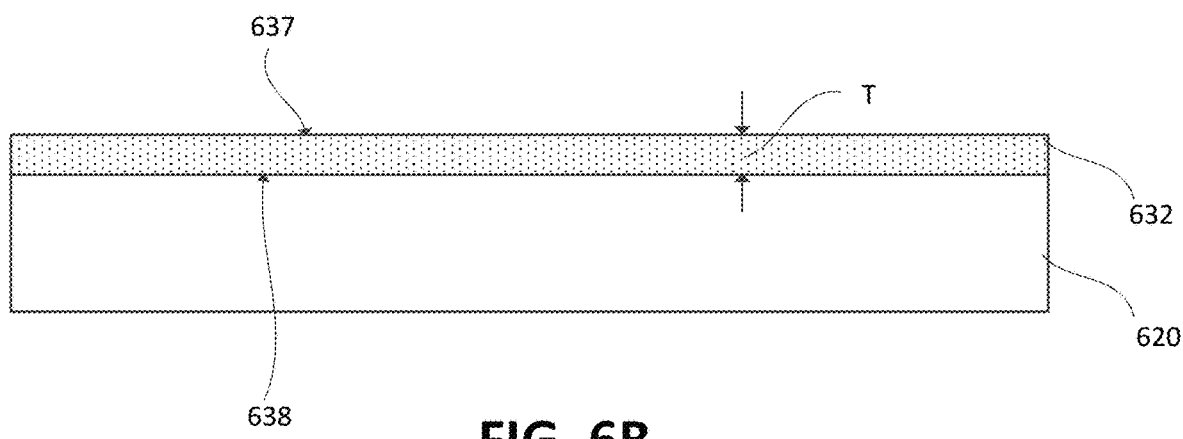
FIG. 6B is a cross-sectional illustration of the substrate mounted on an electrostatic carrier after the substrate has been thinned, according to an embodiment.

Referring now to operation 552, process 550 may continue with thinning the substrate 630 to form a thinned substrate 632. A thinned substrate 632 mounted to the ESC 620 is shown in FIG. 6B. In an embodiment, the thinned substrate 632 may have a thickness T that is less than approximately 50 μm. In an embodiment, the thickness T may be less than approximately 10 μm. Such thicknesses may be obtained due to the high quality bond between the ESC 620 and the substrate 630. Furthermore, since the thinned substrate 630 is supported by the ESC 620, it may be handled and/or processed further without risking damage to the thinned substrate 630. According to an embodiment, the thinned substrate 632 still includes the backside surface 637 facing away from the ESC 620.

Referring now to operation 553, process 550 may continue with transferring the substrate to a second ESC with the front side of the substrate facing away from the second ESC. For example, the substrate 632 may be bonded to the second ESC with the aligner/bonder/debonder tool 114 in substantially the same manner the first ESC is bonded to the thinned substrate 632.

FIG. 6B is a cross-sectional illustration of the substrate 632 bonded to the first ESC 620 and the second ESC 621, according to an embodiment. As shown, the thinned substrate 632 includes a backside surface 637 that is facing towards (and in contact with) the second ESC 621 and a front side surface 638 that is facing towards (and in contact with) the first ESC 620. It is to be appreciated, that such a configuration allows for improved protection of the thinned substrate 632 since it is supported on both surfaces by the first and second ESCs 620/621. Accordingly, a thinned substrate 632 may be transported throughout a facility without a high risk of damage.

Figure 6C:
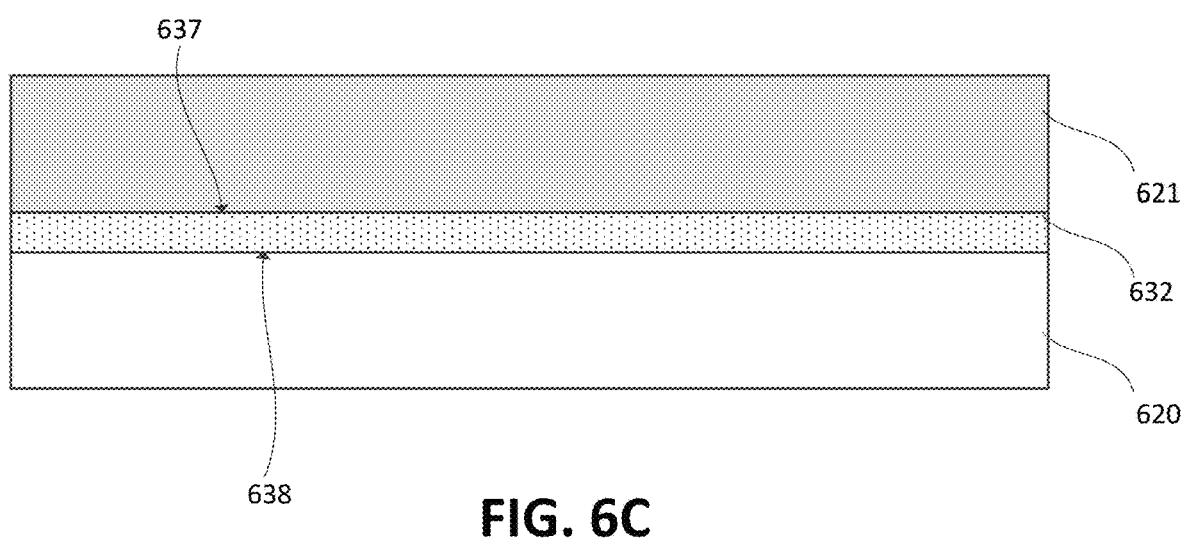
FIG. 6C is a cross-sectional illustration of the thinned substrate as it is being transferred to a second electrostatic carrier, according to an embodiment.
Figure 6D:
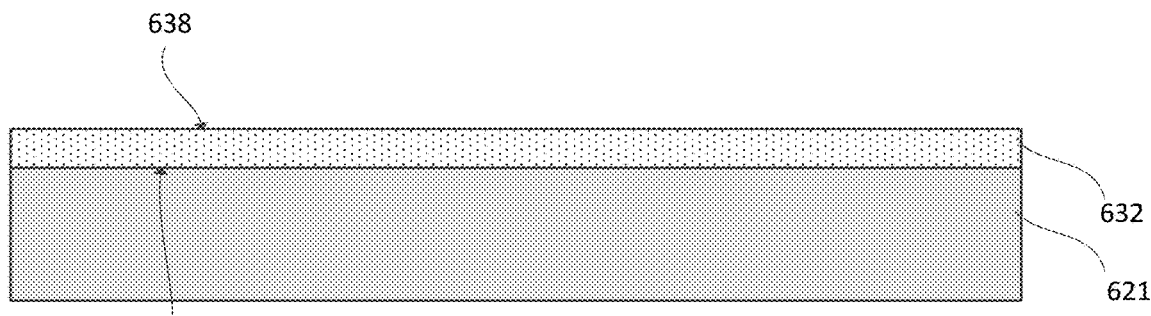
FIG. 6D is a cross-sectional illustration of the thinned substrate after it has been transferred to the second electrostatic carrier, according to an embodiment.

Referring now to FIG. 6D, a cross-sectional illustration of the substrate 632 after the first ESC 620 has been removed is shown, according to an embodiment. In an embodiment, the first ESC may be debonded from the thinned substrate in the bonder/debonder 114. According to an embodiment, the electrostatic force between the first ESC 620 and the thinned substrate 632 may be released. At this point, the first ESC 620 and the thinned substrate 632 are still in direct contact with each other. Mechanically separating the first ESC 620 from the thinned substrate 632 may result in damage to the thinned substrate 632 since the reduced thickness diminishes the structural integrity of the thinned substrate 632. Accordingly, embodiments include injecting air or any other suitable gas between the first ESC 620 and the thinned substrate 632 in order to allow the detachment of the first ESC 620 without any mechanical intervention. For example, the air purge may be uniformly applied through the purge holes of the first ESC 620. As shown in FIG. 6D, the front side surface 638 of the thinned substrate 632 may now be exposed.

Referring now to operation 554, process 550 may continue with cleaning the front side surface 638 of the thinned substrate, according to an embodiment. The cleaning process may be any suitable cleaning process known in the art. In some embodiments the cleaning process may be optionally omitted.

Figure 6E:
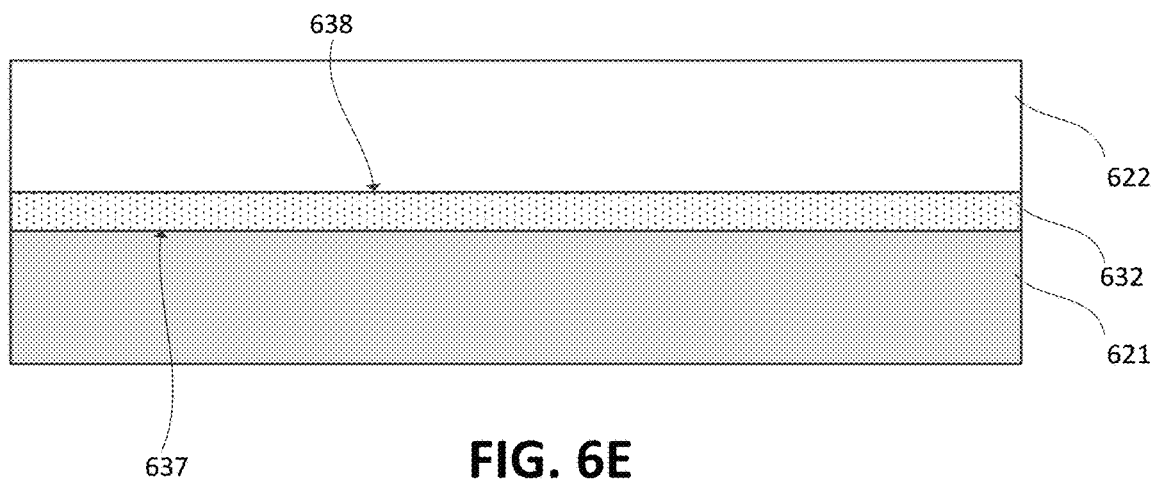
FIG. 6E is a cross-sectional illustration of the thinned substrate as it is being transferred to a third electrostatic carrier, according to an embodiment.
Figure 6F:
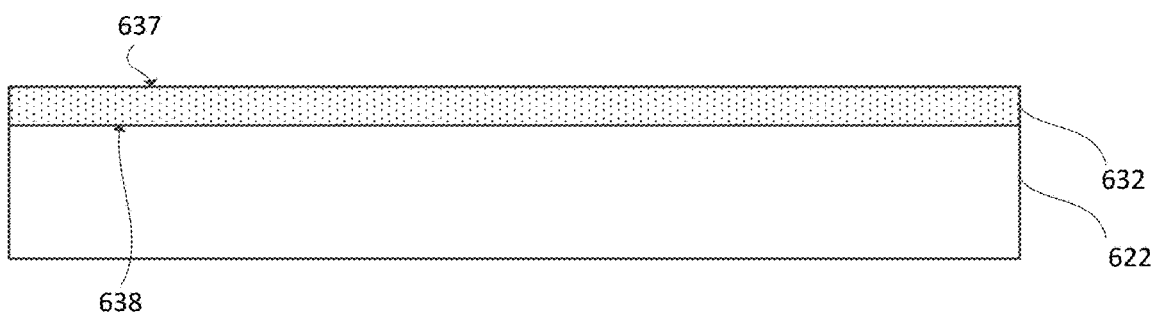
FIG. 6F is a cross-sectional illustration of the thinned substrates after it has been transferred to the third electrostatic carrier, according to an embodiment.

Referring now to operation 555, process 55 may continue with transferring the thinned substrate 632 to a third ESC 622 so that a backside surface 637 of the thinned substrate 632 is exposed, according to an embodiment. Such a transfer process may be substantially similar to the transfer of the thinned substrate from the first ESC 620 to the second ESC 621 described above with respect to FIGS. 6C and 6D. For example, in FIG. 6E, the third ESC 622 is bonded to the front side surface 638 of the thinned substrate 632. The third ESC 622 may be bonded to the front side surface 638 of the thinned substrate in the bonder/debonder tool 114 with similar processes described above with respect to FIG. 6C. Thereafter, the second ESC 621 may be debonded from the thinned substrate 632 with similar processes described above with respect to FIG. 6D.

It is to be appreciated that the third ESC 622 is not necessarily a different ESC than the first ESC 220. For example, the two ESCs may be used to transfer a single substrate between them. In additional embodiments, three or more different ESCs may be used to transfer a single substrate.

Figure 6G:
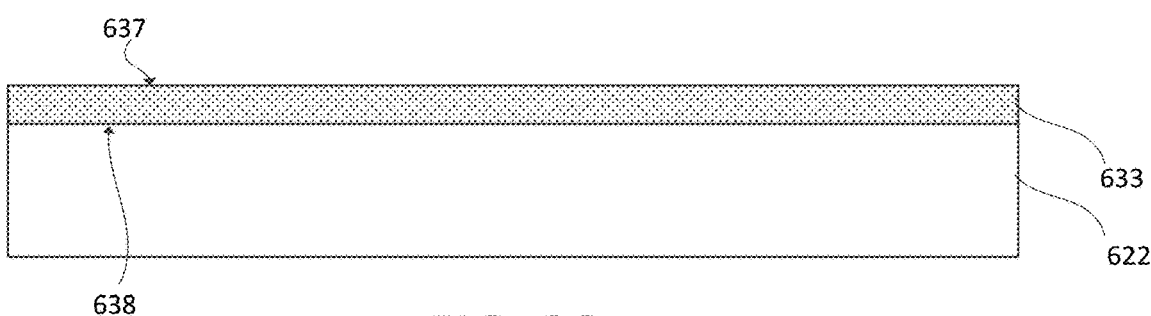
FIG. 6G is a cross-sectional illustration of the thinned substrate after it has been processed, according to an embodiment.

Referring now to operation 556, process 550 may continue with processing the thinned substrate 632, according to an embodiment. An example of a processed substrate 633 is shown in FIG. 6G. The processed substrate 633 is illustrated with different shading than the unprocessed substrate 632 in order to represent some change to the substrate. While the entire substrate is shaded differently, it is to be appreciated that the processing may alter the exposed backside side surface 637 of the thinned substrate 632 or any other portion of the thinned substrate 632. According to an embodiment, the thinned substrate 632 may be processed with any suitable processing operation. For example the thinned substrate 632 may be processed with one or more processes such as, etching, CVD, PVD, ECD, CMP, or the like. In an embodiment, the processing may also include cleaning the surface of the thinned substrate 632 prior to subsequent processing. According to an embodiment, the thinned substrate 632 may be processed in a tool other than the cluster tool 100. Additional embodiments may also include a processing tool that is integrated with the cluster tool 100.

After processing, the processed substrate 633 and the third ESC 622 may be transferred back to the cluster tool 100 (if the processing was implemented in an external tool) and delivered to the tape frame transfer module 118 by robot 192. Once in the transfer module 118, process 550 may continue with operation 557 that includes transferring the processed substrate 633 to a tape frame. In an embodiment, the transfer of the processed substrate 633 to the tape frame may be implemented in substantially the same manner as described above with respect to FIGS. 4D-4F, and therefore will not be repeated here.

Thereafter, at operation 558, the process 550 may include removing the tape frame and the attached processed substrate 633 from the cluster tool 100 (e.g., with robot 192) so that the processed substrate 633 may be diced. The dicing process may be any suitable dicing process known in the art. For example, the processed substrate 633 mounted on the tape frame may be diced with a laser dicing tool, a mechanical dicing tool, or a combination of any suitable tools.

In process 550 described above, a single substrate processing operation was described. However, it is to be appreciated that embodiments may include a plurality of substrate processing operations. For example, the front side surface of the thinned substrate 632 may be processed after it is exposed after operation 553. In some embodiments, cleaning operation 554 may also include any other substrate processing operation, such as, etching, CVD, PVD, ECD, CMP, or the like. Accordingly, embodiments include the ability to process both the front side surface 638 and the backside surface 637 of a single thinned substrate 632. Furthermore, it is to be appreciated that any number of transfer processes (e.g., operation 553 or operation 555) may be implemented in order to allow for a plurality of substrate processing operations on either surface of the thinned substrate 632 in any needed order.

Figure 7:
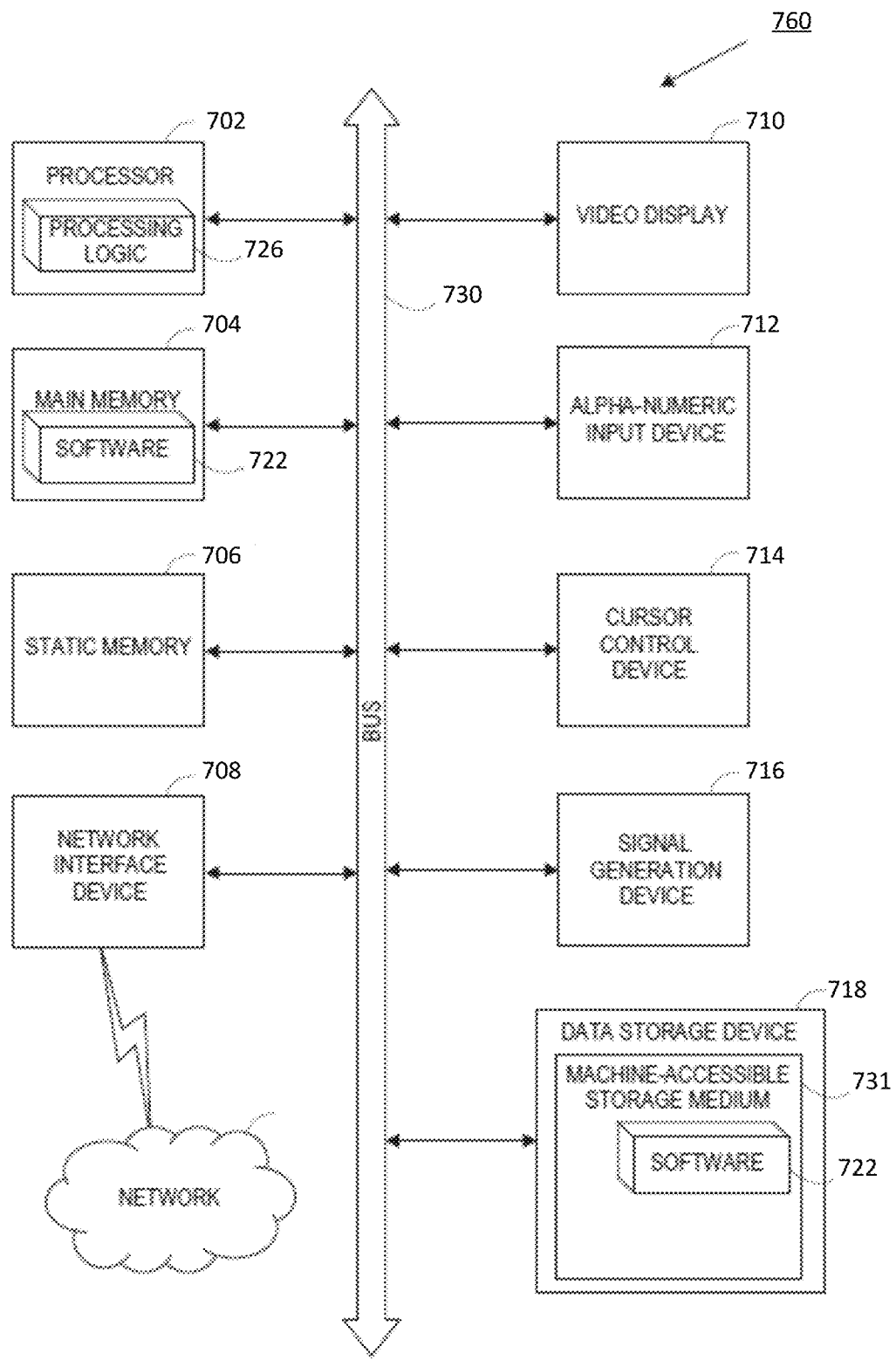
FIG. 7 illustrates a block diagram of an exemplary computer system that may be used in conjunction with processes that include processing thinned substrates with electrostatic carriers, in accordance with an embodiment.

Referring now to FIG. 7, a block diagram of an exemplary computer system 760 of a processing tool is illustrated in accordance with an embodiment. In an embodiment, computer system 760 is coupled to and controls processing in the processing tool. Computer system 760 may be connected (e.g., networked) to other machines in a Local Area Network (LAN), an intranet, an extranet, or the Internet. Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 720 via the system network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method for processing thin substrates, comprising:
electrostatically bonding a substrate to an electrostatic carrier (ESC);
thinning the substrate to form a thinned substrate;
processing the thinned substrate, wherein the thinned substrate remains attached to the ESC during the processing of the thinned substrate, and wherein the processing comprises one or more of an etching process, a cleaning process, and a deposition process; and
transferring the thinned substrate from the ESC directly to a tape frame.

2. The method of claim 1, wherein the ESC includes purge holes, and wherein electrostatically bonding the substrate to the ESC includes vacuum coupling the substrate to the ESC prior to initiating the electrostatic bond between the substrate and the ESC.

3. The method of claim 1, further comprising:
aligning the substrate to the ESC prior to bonding the substrate to the ESC.

4. The method of claim 3, wherein a center of the substrate is within approximately +/−40 µm of a center of the ESC.

5. The method of claim 1, further comprising:
preconditioning the ESC prior to bonding the substrate to the ESC.

6. The method of claim 5, wherein preconditioning the ESC includes one or more of a baking process, a cooling process, and a vacuum purge process.

7. The method of claim 6, wherein the preconditioning process is implemented under a vacuum between 10 Torr and 1E-6 Torr.

8. The method of claim 1, wherein transferring the substrate to the tape frame comprises:
releasing the electrostatic charge from the ESC; and
applying a purge gas between the surfaces of the ESC and the substrate prior to mechanically separating the ESC from the substrate.

9. The method of claim 1, wherein the process is implemented in a cluster tool that includes one or more of an aligner, a bonder/debonder, an ESC conditioner, and a tape frame transfer tool.

10. The method of claim 1, wherein the thinned substrate has a thickness less than 50 µm.

11. A method for processing thin substrates, comprising:
electrostatically bonding a substrate to a first electrostatic carrier (ESC), wherein a backside of the substrate is facing away from the first ESC;
thinning the substrate to form a thinned substrate;
transferring the thinned substrate to a second ESC, wherein a front side of the thinned substrate is facing away from the second ESC;
cleaning the front side surface of the thinned substrate;
transferring the thinned substrate to a third ESC, wherein a backside of the thinned substrate is facing away from the third ESC;
processing the backside surface of the thinned substrate; and
transferring the thinned substrate to a tape frame.

12. The method of claim 11, wherein transferring the thinned substrate to the second or third ESC comprises:
releasing the electrostatic charge from the previous ESC; and
applying a purge gas between the surfaces of the previous ESC and the thinned substrate prior to mechanically separating the thinned substrate from the previous ESC.

13. The method of claim 11, further comprising:
processing the front side surface of the thinned substrate prior to transferring the thinned substrate to the third ESC.

14. The method of claim 11, wherein the third ESC is the same ESC as the first ESC.

15. The method of claim 11, further comprising:
aligning the substrate to the first ESC prior to bonding the substrate to the first ESC.

16. The method of claim 15, wherein a center of the substrate is within approximately +/−40 µm of a center of the first ESC.

17. The method of claim 11, wherein the first, second, and third, ESCs include purge holes, and wherein electrostatically bonding the substrate to one of the ESCs includes vacuum coupling the substrate to the ESC prior to initiating the electrostatic bond between the substrate and the ESC.

18. The method of claim 11, wherein the thinned substrate has a thickness less than approximately 50 µm.

19. A method for processing a thin substrate, comprising:
aligning a substrate and an electrostatic carrier (ESC) with a notch aligner;
preconditioning the ESC, wherein preconditioning the ESC includes one or more of a baking process, a cooling process, and a vacuum purge process;
aligning the substrate to the ESC, wherein a center of the substrate is within approximately +/−40 µm of a center of the ESC;
electrostatically bonding the substrate to the ESC, wherein the ESC includes purge holes, and wherein electrostatically bonding the substrate to the ESC includes vacuum coupling the substrate to the ESC prior to initiating the electrostatic bond between the substrate and the ESC;
thinning the substrate to form a thinned substrate;
processing the thinned substrate, wherein the thinned substrate remains attached to the ESC during the processing of the thinned substrate, and wherein the processing comprises one or more of an etching process, a cleaning process, and a deposition process; and
transferring the thinned substrate from the ESC directly to a tape frame, wherein transferring the substrate to the tape frame comprises:
releasing the electrostatic charge from the ESC; and
applying a purge gas between the surfaces of the ESC and the substrate prior to mechanically separating the ESC from the substrate.

20. The method of claim 19, wherein a thickness of the thinned substrate is less than 50 µm.

* * * * *